(12) United States Patent
Dominguez et al.

(10) Patent No.: US 11,145,632 B2
(45) Date of Patent: Oct. 12, 2021

(54) HIGH DENSITY DIE PACKAGE CONFIGURATION ON SYSTEM BOARDS

(71) Applicant: Intel Corporation, Santa Clara, CA (US)

(72) Inventors: Juan E. Dominguez, Chandler, AZ (US); Hyoung Il Kim, Folsom, CA (US); Bilal Khalaf, Folsom, CA (US); John Gary Meyers, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/636,616

(22) PCT Filed: Sep. 29, 2017

(86) PCT No.: PCT/US2017/054487
§ 371 (c)(1),
(2) Date: Feb. 4, 2020

(87) PCT Pub. No.: WO2019/066937
PCT Pub. Date: Apr. 4, 2019

(65) Prior Publication Data
US 2020/0381406 A1    Dec. 3, 2020

(51) Int. Cl.
*H01L 25/10* (2006.01)
*H01L 23/31* (2006.01)
*H01L 25/065* (2006.01)

(52) U.S. Cl.
CPC ........ *H01L 25/105* (2013.01); *H01L 23/3128* (2013.01); *H01L 25/0657* (2013.01);
(Continued)

(58) Field of Classification Search
CPC ....... H01L 25/0657; H01L 2225/06562; H01L 2225/1058; H01L 2225/107; H01L 2225/0651; H01L 2225/06517; H01L 2225/1023; H01L 2225/1041; H01L 2225/06513; H01L 2225/06506; H01L 2225/06548; H01L 25/18; H01L 25/50;
(Continued)

(56) References Cited

U.S. PATENT DOCUMENTS 5,397,747 A    3/1995  Angiulli et al.
6,683,372 B1   1/2004  Wong et al.
(Continued)

OTHER PUBLICATIONS

International Search Report and Written Opinion for International Patent Application No. PCT/US2017/054487 dated Jun. 28, 2018, 16 pgs.
(Continued)

*Primary Examiner* — Jasmine J Clark
(74) *Attorney, Agent, or Firm* — Schwabe, Williamson & Wyatt, P.C.

(57) ABSTRACT

A high density die package configuration is shown for use on system boards. In one example, an apparatus includes a system board, a first package mounted to the system board, a second package mounted to the system board, and an interface package mounted between the first and the second package and coupled directly to the first package and to the second package through the respective first and second packages.

20 Claims, 5 Drawing Sheets

(52) U.S. Cl.
CPC .............. *H01L 2225/06562* (2013.01); *H01L 2225/107* (2013.01); *H01L 2225/1058* (2013.01)

(58) Field of Classification Search
CPC ........... H01L 23/5389; H01L 23/49811; H01L 23/3128; H01L 2224/48227; H01L 2924/15192; H01L 2924/15311; H01L 25/105

See application file for complete search history.

(56) References Cited

U.S. PATENT DOCUMENTS

| | | | |
|---|---|---|---|
| 2003/0015777 A1 | 1/2003 | Benedix et al. | |
| 2006/0151867 A1* | 7/2006 | Karnezos | H01L 25/03 257/686 |
| 2008/0080261 A1* | 4/2008 | Shaeffer | G11C 7/222 365/189.05 |
| 2016/0079196 A1 | 3/2016 | Teh et al. | |
| 2016/0141234 A1 | 5/2016 | We et al. | |

OTHER PUBLICATIONS

International Preliminary Report on Patentability for International Patent Application No. PCT/US2017/054487, dated Apr. 9, 2020, 12 pgs.

* cited by examiner

HIGH DENSITY DIE PACKAGE CONFIGURATION ON SYSTEM BOARDS

CROSS-REFERENCE TO RELATED APPLICATION

This patent application is a U.S. National Phase Application under 35 U.S.C. § 371 of International Application No. PCT/US2017/054487, filed Sep. 29, 2017, entitled "HIGH DENSITY DIE PACKAGE CONFIGURATION ON SYSTEM BOARDS," which designates the United States of America, the entire disclosure of which is hereby incorporated by reference in its entirety and for all purposes.

FIELD

The present description relates to the field of microelectronic devices and, in particular, to arranging and mounting die packages on a system board.

BACKGROUND

Electronic devices are constantly moving to higher density with more memory and more processing in ever smaller form factors. New memory architectures and higher memory performance are being developed and then pushed into these smaller form factors. Small high density electronics are desired for portable communications devices, as well as for Internet of Things (IoT) technology in embedded systems. High capacity storage is also needed for future data center and cloud applications as well as for compact client applications.

Most memory systems today place memory chips, controllers, voltage regulators, external interface chips, and a few other components side-by-side on a single printed circuit board (PCB). The memory is typically in a separate package from the other components although some of the other components can be combined. With current components more than half of the PCB is required for components that are not the memory chips.

In order to reduce the space required for all of these other components, some systems stack the packages vertically. Other solutions involve embedding some of the packages in the PCB/substrate. While the resulting memory system is more compact, stacking and embedding are expensive and more difficult to manufacture.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

A high capacity storage solution is described that is suitable for future data center and cloud applications as well as for compact client applications. Additional integration and better space utilization are described herein that provide smaller form factors to high density memory system markets. The available board space is used more efficiently by placing components and packages below or above larger storage media components (such as Flash or DRAM (Dynamic Random Access Memory) BGA (Ball Grid Array) packages.

Figure 1:
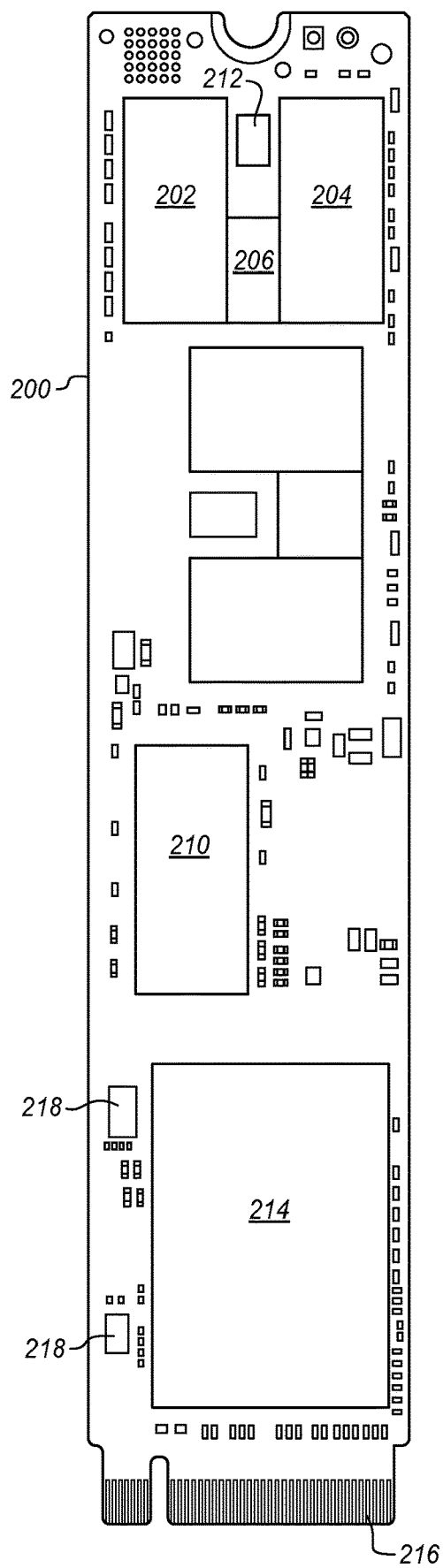
FIG. 1 is a top plan view diagram of a memory drive using an interface package between memory package pairs according to an embodiment.

FIG. 1 is a top plan view diagram of an example of a common memory system based on a system board, such as a PCB (Printed Circuit Board), 200 with a specific form factor. There may be a cover over the illustrated components (not shown). This example is an M.2 SSD (Solid State Drive). The M.2 SSD has pairs of memory packages 202, 204 soldered to the PCB with a BGA (Ball Grid Array) or another similar attachment. For each pair of memory packages, there is an interface, such as a controller package 206, between the memory packages and coupled to the PCB as described in more detail below. Passive and power conditioning components 212 may also be placed between the memory packages to service the pair of memory packages. Multiple pairs of memory packages with associated controllers and passives may be attached across the PCB to complete the intended memory capacity of the SSD.

The SSD also includes a bank of SDRAM (Synchronous Dynamic Random Access Memory) 210 to be used as a buffer to the memory and a memory array controller 214 for management and control of higher level functions of the SSD. One end of the SSD has a connector 216 to attach to an external system and interface chips 218 connect power and signals on the connector to the other components of the SSD.

In this example, the packages are all connected through package substrates, then through connector arrays, and then through the PCB through traces of the PCB to other components, as is suitable for the particular memory system architecture. As an example, the controller package 208 contains one or more dies mounted to a substrate or redistribution layer that is coupled to the PCB 200. The controller die receives power and data through the substrate and the PCB from the SDRAM 210 and system controller 214 and routes these to a substrate or redistribution layer of a respective memory package 202, 204 to an appropriate memory die within the respective package. The memory controller is coupled to the two memory packages through the PCB or directly to each of the two memory packages as described below.

The M.2 SSD form factor is used in mobile, portable, and fixed systems from tablet computers and set-top boxes to servers and workstations. The memory packages may contain a small or large amount of data storage cells and there may be one or many pairs of memory packages on the SSD. The connector 216 may take different forms and provide a variety of different data interface types. The most common types at present are SATA (Serial Advanced Technology Attachment) and SAS (Serial Attached Small Computer System Interface), however, embodiments are not so limited. In addition, embodiments described herein may be applied to other form factors and interfaces so that the PCB, interfaces, and connector may take many other forms. Other common form factors include the 2.5" small form factor SSD, mSATA, and PCIe (Peripheral Component Interconnect express), however embodiments apply to other form factors with other interface types. The 2.5" form factor typically has an aluminum cover over all of the components, which the package and the system board are exposed with an mSATA form factor. The M.2 SSD is provided as an example to show the principles and features related to various embodiments.

Figure 2:
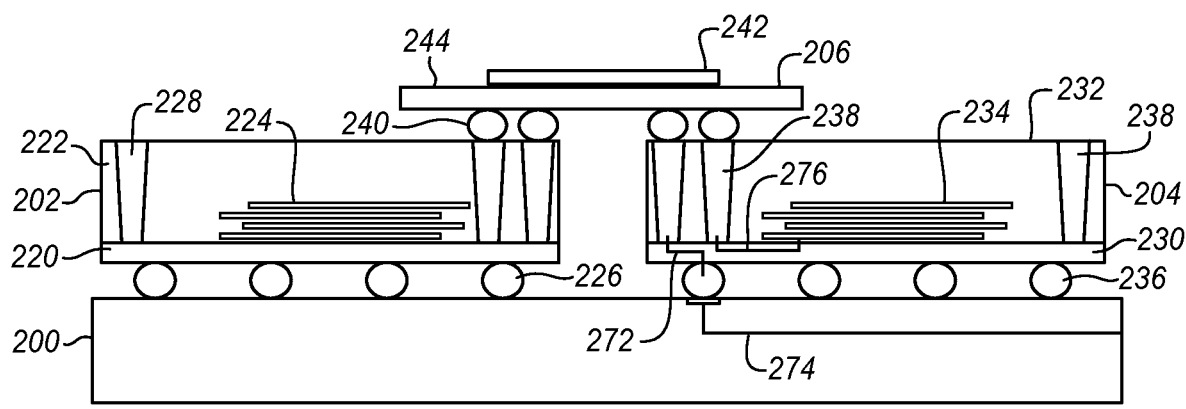
FIG. 2 is a side cross-sectional view diagram of an interface package between a memory package pair according to an embodiment.

FIG. 2 is side cross-sectional view of a pair of memory packages and a controller package as shown in FIG. 1. Only a portion of the system board is shown. The system board may include surface traces and may have multiple layers (not shown) with power and data lines within the system board.

A first one of the memory packages 202 is attached to the system board 200 with any of a variety of suitable connections systems, such as a BGA 226, LGA (Land Grid Array), C4 (Controlled Collapse Chip Connection) or any other suitable connection system. The package 202 has a substrate 220 and a stack of memory dies 224. The dies are coupled to the substrate for data and power using any suitable structure, such as a BGA, wire leads, or any other system. In the illustrated example, the dies and the substrate are covered with a suitable cover 222, such as a mold compound, epoxy, or resin. A polymer package cover may also or alternatively be used. Conductive lines 228, shown as through mold vias couple the substrate to the top of the package 222 and provide a land at the top of the package for attachment. Other connections to the top of the package, including wire leads, Cu post, or an interposer, may alternatively be used.

The second one of the memory packages 204 has a similar structure. A stack of memory dies 234 is mounted and electrically connected to a substrate 230 or redistribution layer of any appropriate type. The substrate is attached with solder balls 236 or another system to the system board 200. The dies are enclosed by a package cover 232. Through-mold vias (TMV) 238 connect electrical lines on or in the substrate to the top of the package cover. The memory packages are positioned on the system board so that the controller package 206 bridges the gap between the two memory packages. The controller package is shown as having only a die 242 attached to a substrate 244, however, there may be additional dies, passive devices, voltage regulator components, additional wiring layers, covers, and other features to the controller package. These additional components are not shown for the controller and memory packages in order not to obscure the invention. Any of a variety of different types of packages may be used.

The controller package is attached to both of the memory packages using solder balls 240 in any of a variety of suitable configurations, including a BGA, LGA, C4 or any other suitable attachment system. The controller package has lands or pads on the substrate and solder balls or another connector that are positioned to connect to lands or pads on the top surfaces of the memory packages. As shown, the vias are coupled to the substrates of the memory packages so that the controller is electrically coupled to the substrate of both of the memory packages through the respective vias.

In particular one of the vias 238 extends from the top surface 232 of the memory package to the memory package substrate 230 and is coupled to a patterned wiring layer 276 in the substrate. The patterned wiring layer 276 connect to the memory dies 234 in the package. Only one connecting wiring layer is shown, but there may be many more. The wiring layer may include horizontal conductive patterns and vertical vias to connect patterns of one layer to patterns of another layer. The connections may be used for data, power, and control signals.

The memory package substrates 230 may also be coupled to the system board 200 through the solder ball 226, 236 connections. This allows data, power, and control to be provided to the memory dies 234 of the memory package and also allows the controller to be coupled through the memory packages to the system board 200. As shown a via 238 may be coupled to a trace or wiring layer 272 of the package substrate that is then coupled through a solder ball 236 or other connector to the system board 200. Within the system board, additional patterned wiring layers 274 may couple the controller 206 to other components of the system board (not shown) such as power, data, or a memory array controller.

Accordingly, using the vias, the controller die 242 may be coupled to the memory dies 224, 234 through the package substrates 220, 230 without using the system board or passing signals through the system board. The data and control signals may pass directly through the package substrates and the vias. This provides a benefit of simplifying the system board 200. Any data to be written to the memory dies may be sent through the system board on system board wiring 274 through the package substrate 272 to the controller die. The connection to the memory dies 276 does not require any lines, traces or connections in the system board.

Also using the vias 228, 238, the controller die 242 may receive power, control, and data from the system board through one or both of the memory package substrates 220, 230. The memory dies 224, 234 may also be directly powered through the system board.

The connections through the package substrates and system boards may be made in any of a variety of different ways. For a conventional printed circuit board, patterned conductive layers are applied to a dielectric layer. For a multilayer board, another dielectric layer is applied and a patterned conductive layer is applied over the second dielectric layer. The two patterned layers are connected through the second dielectric layer by vertical vias. The layers are repeated to form all of the desired layer. Alternatively, build-up layers may be used, wiring within a substrate and other techniques. The substrates and system boards may be single or multiple layer and embodiments herein are not limited to any particular package, substrate, PCB or other technology. While PCB is used to describe particular example, any other type of connector layer may be used as may be appropriate for any particular use.

The approach shown in FIG. 2 provides for prepackaged units 202, 204 to be assembled on the PCB 200. The prepackaged units may be assembled with BGA with a relatively large standoff. A standoff from about 0.4-0.5 mm conforms easily to most form factor standards. Supporting packages 206 are also prepackaged and can fit in between the larger packages. While only one supporting package is shown, there may be many more. In many embodiments, these supporting packages are smaller and much lower in z-height in comparison to the larger packages that are directly attached to the PCB.

In these embodiments, the controller and any other suitable packages are stacked above the prepackaged memory ICs (Integrated Circuits). The space between the memory ICs is used to reduce total space needed on the system board. Through-mold vias may be used to connect to the memory package substrates and the system board to carry signals to the package substrates and then down to the system board. The smaller package may be attached to the TMV using solder, Cu post thermal compression, or a similar methodology. Using this approach, the space between memory packages, as shown in FIG. 1 may be reduced. By placing the memory packages closer together, more memory packages may be placed on a single system board. This tighter placement may be used to increase the total memory capacity of the SSD. Alternatively more lower capacity memory packages may be used to reach the same total memory. This may allow lower cost memory packages to be used reducing total system cost.

Figure 3:
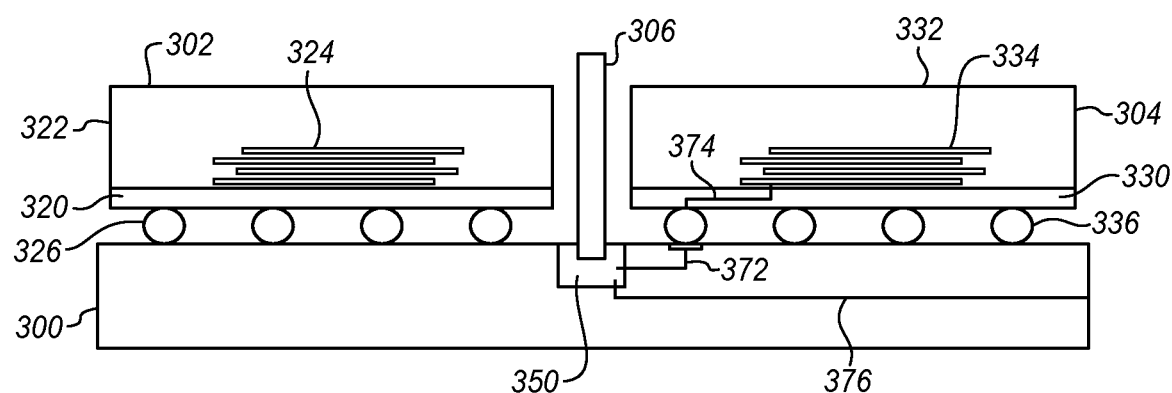
FIG. 3 is a side cross-sectional view diagram of an alternative controller package between a memory package pair according to an embodiment.

FIG. 3 is a side cross-sectional view diagram of an alternative controller package between a memory package pair. This shows an alternative configuration for the controller package and any other suitable packages. In this example, the controller package 306 is connected directly to the system board 300 between the two memory packages 302, 304. However, the controller package is mounted vertically and directly into the system board. As in the example of FIG. 2, each memory package 302, 304 has one or more dies 324, 334 attached to a respective substrate 320, 330 or redistribution layer. The substrates are attached to a system board 300 using BGA or another suitable connection 326, 336. The packages may be covered in mold compound or any other suitable covering 322, 332. Alternatively, the dies may be uncovered, depending on the implementation and intended use for the memory system. All of the connections for the memory packages in this example are through the system board. The controller may be any type (BGA, QFN (Quad Flat No-Lead), or wafer level) of controller which can be attached to the exposed TMV array.

The controller die 342 is packaged in a manner similar to that of FIG. 2 and is mounted to a substrate 344 to form the controller package 306. However, in this embodiment, the system board has a socket 350 that mates to a connector 340 at the end of the controller package substrate.

The signal routing is different for this example than for that of FIG. 2. In the example of FIG. 3, the controller package 306 is coupled to the socket 350 for data, power and control. The socket is coupled to wiring 372 in the system board 300 to connect the controller package through a solder ball 336 or other connector to the memory die package substrate 330. The connection is routed from the solder ball through a trace, pattern, or lead 374 in the package substrate to an appropriate connection point from the substrate to the memory die or dies 334 of the package. Similarly other traces, patterns, or leads 376 connect the controller package 306 through the socket 350 to other components (not shown) on the system board. While only two connections are shown, there may be many more.

Figure 4:
FIG. 4 is a side plan view of the interface package of FIG. 3 according to an embodiment.

FIG. 4 is a side plan view of the controller package 306 of FIG. 3 showing a package substrate 344 that carries the controller die 342. The end of the package substrate has an extension 340 that is configured to mechanically and electrically connect to the socket 350 in the system board.

Figure 5:
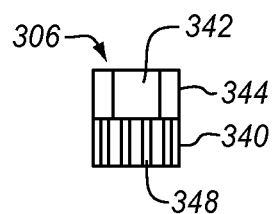
FIG. 5 is a top plan view of the interface package of FIG. 3 according to an embodiment.

FIG. 5 is a top plan view of the controller package 306 of FIG. 3 showing the same parts. In this view, the connector 340 shows an array of parallel, linear, conductive traces 348. In some embodiments, the conductive traces are surface traces on a PCB material of the package substrate. Such traces may be produced inexpensively and may be used to provide a secure connection for corresponding traces inside the socket of the PCB. Other types of connector interfaces may be used instead of the traces.

As shown some packages may be fit vertically on the system board to reduce space as compared to a horizontal placement. In the drawing figures, the system board is considered to be horizontal and the memory packages are also horizontal and thereby parallel to the system board. The vertical controller board is orthogonal to both the system board and the memory packages. Thick plated finger connections may be created on the controller substrate or another supporting package substrate. Mating finger connections may be created on the system board. The package may be vertically attached to the socket in the substrate or directly to the substrate mechanically or using conductive paste, film, or regular reflowable solder. The paste, film, or solder may be between the socket and the connector to grip the connector in the socket.

The examples herein are presented in the context of increasing the density on a PCB of a solid state memory drive as shown in FIG. 1. By placing the memory packages closer together, more memory packages can be accommodated on the same size PCB. In some systems there may be 8, 10, or more pairs of memory packages. Placing the packages of each pair closer together may allow room for one or more additional pairs of memory packages. As mentioned the larger number of packages may be used to increase the total memory capacity of the drive or to allow cheaper, lower capacity packages to be used.

However, embodiments are not limited to memory packages sharing a controller package. The memory packages may share other packages instead of or in addition to a controller package, depending on the particular memory implementation. The controller packages in the figures may alternatively represent power management packages, voltage regulator packages, interface packages, or various types of ASICs (Application Specific Integrated Circuits), or other types of Integrated Circuit (IC) packages. There may be one or more than one package mounted across or between the memory packages. In all of these example, the in between package will have an interface with or between the two larger packages and so will be referred to generally as an interface package and this includes controllers, power regulators, and other types of packages.

Embodiments are also not limited to memory packages, but may also include other types of packages with an interface package in between. As examples, there may be a processor and a memory with a hub in between. There may be a baseband package and an RF (Radio Frequency) packages with an interface or modulator in between. There may be general processor and a graphics processor with an interface or hub in between, or any of a variety of other types of combinations.

Figure 6:
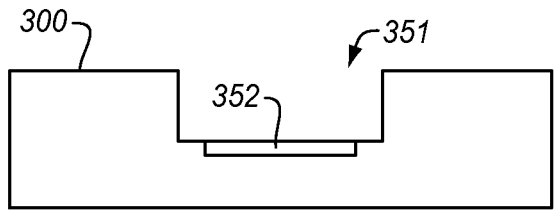
FIGS. 6-8 are side cross-sectional views of attaching a vertical package to a system board according to an embodiment.
Figure 7:
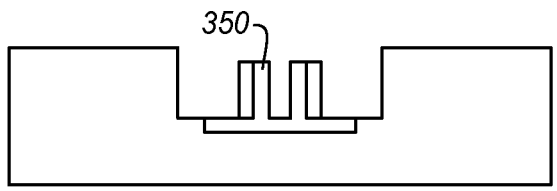
Figure 8:
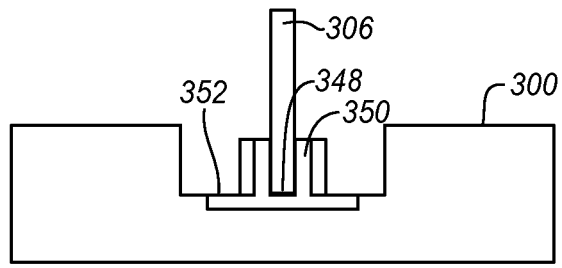

FIGS. 6-8 are side cross-sectional views of attaching a vertical package to a system board as shown in FIG. 5. In FIG. 6, a system board 300 has a cavity 351 with a size that has been configured to receive the connector end of the controller package. A conductive trace 352 has been exposed at the bottom of the cavity. In embodiments, the system board is a multiple layer printed circuit board with alternating dielectric and conductive layers, such as patterned copper layers, although other metals may alternatively be used. The system board is formed with a copper pattern in one copper layer that is configured to provide the connections for data and power to and from the memory controller package. The cavity is milled, etched, or machined to expose this layer for access by the socket 350.

FIG. 7 shows the vertical connector 350 attached to the exposed copper layer 352 within the cavity as shown in FIG. 6. The connector may be prefabricated and then attached with a solder paste or adhesive to connections on the exposed copper layer in the cavity.

FIG. 8 shows the controller package 306 attached to the socket 350. The package is attached using an edge connector 348 as shown in FIG. 5 that is inserted into the socket. The package may be secured in place in the connector using a solder paste, a conductive film or any other suitable attachment.

Figure 9:
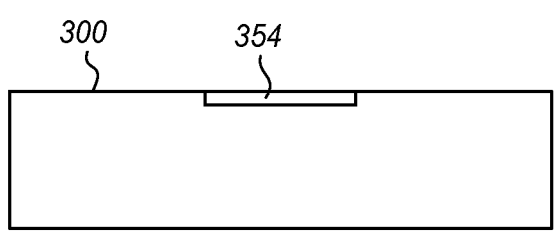
FIGS. 9-11 are side cross-sectional views of attaching a vertical package to a system board according to an alternative embodiment.
Figure 10:
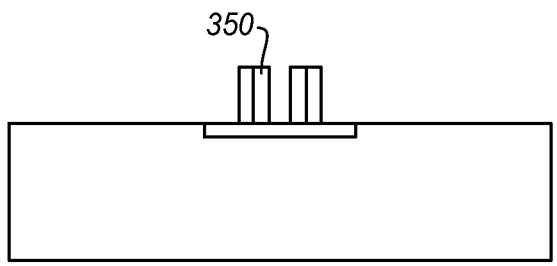
Figure 11:
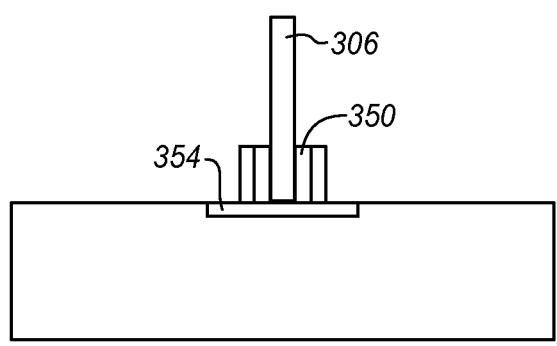

FIGS. 9-11 are side cross-sectional views of attaching a vertical package to a system board as in FIG. 5 without using the cavity 351 shown in FIGS. 6-8. In FIG. 9, the system board is fabricated in a similar way to that of FIG. 6. However, the conductive traces for connection to the controller package are surface traces instead of the embedded traces as in FIG. 6. A connector 354 is patterned onto the surface to provide the electrical connections required for the socket. As in the other figures, there may be multiple conductive layers and vertical connecting vias through the system board that are used to make all of the many connections for the various packages and passives that are mounted to the system board. These are not shown in these or the other drawing figures in order to simplify the drawing and not to obscure the described features.

FIG. 10 shows that the socket 350 is attached to the connector 354 using e.g. a solder or paste. FIG. 11 shows the controller package 306 attached vertically to the socket 350 in the same way as in FIG. 8. The embodiment of FIG. 11 is less expensive to manufacture because no cavity is required and because at least some of the connections may be made using surface traces. On the other hand, the embodiment of FIG. 8 places the controller package lower within the cavity. The cavity reduces the z-height of the controller package. If there are height limits for the memory system or if the controller package is long, then the cavity may allow the memory system to be thinner overall than without the cavity.

Figure 12:
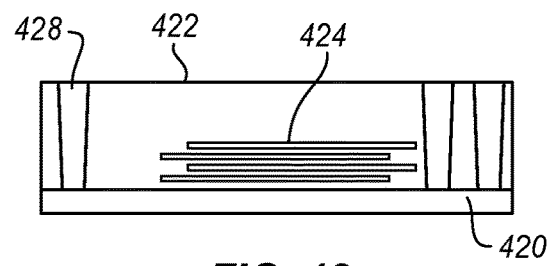
FIGS. 12-15 are side cross-sectional views of attaching an interface package over a pair of packages using a redistribution layer according to an embodiment.

FIGS. 12-15 are side cross-sectional views of attaching a controller package over a pair of packages using a redistribution layer. FIG. 12 is a view of a package 402, such as a memory or controller package, similar to the packages 202, 204 of FIG. 2. The package has one or more dies 424, such as stacked memory dies, a controller, a voltage regulator, or other die mounted to a substrate 420. The substrate and dies are enclosed by a cover 422 such as a mold compound although other covers may be used. TMVs 428 connect the substrate to the top surface of the package.

Figure 13:
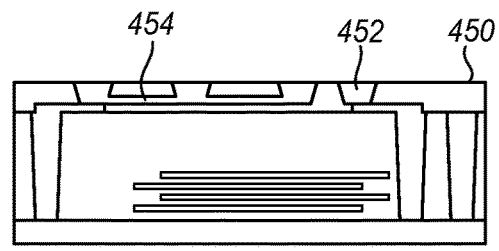

FIG. 13 shows a redistribution layer (RDL) 450 formed over the top surface of the package of FIG. 12. The redistribution layer has alternating dielectric and conductive layers. Vertical vias make contact with the TMVs of the package. Horizontal layers 454 connect the vias of the RDL from one layer to vias at another layer. At the top of the redistribution layer 450, lands or pads 452 are formed. The lands or pads provide connections through the redistribution layer to the package substrate 420.

Figure 14:
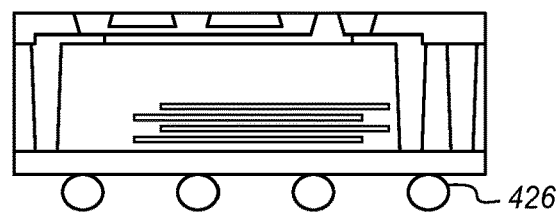

FIG. 14 shows solder balls 426 placed by a ball attach operation on the package 402. The ball grid array or other connection system allows the package 402 to be mounted to a system board 400. This board is typically a PCB as described above.

Figure 15:
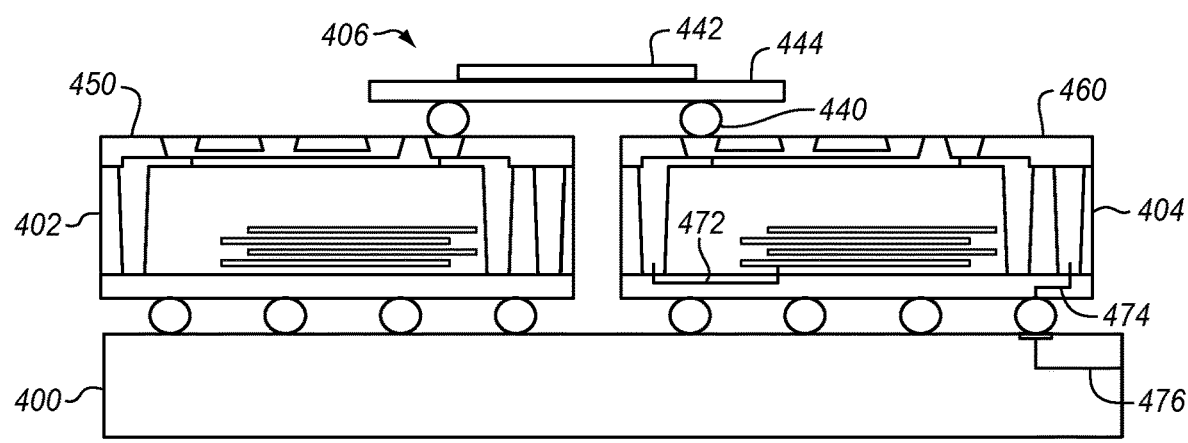

FIG. 15 shows the package 402 mounted to the system board 400 next to another similar package 404. The second package also has an RDL 460 at the top of the package and that is configured to provide the connections required by the particular implementation. A third controller package 406 is mounted over both of the packages and between the packages. The controller package has at least a controller die 442 mounted to a substrate 444. The package may also have additional dies, passives, covers and other components, depending on the particular implementation. The controller package 406 is attached to the RDLs 450, 460 of both of the packages 402, 404 using any suitable electrical attachment 440 including a ball grid array. The controller is coupled from its own package substrate to the redistribution layers. The controller package could be BGA, QFN or wafer level based.

The RDLs provide a connection to the package substrates and from there the controller may be coupled to the memory dies 424 of one or both packages through a trace, pattern or lead 472 in the package substrate from a via to the memory dies. The controller may also be coupled to the system board 400 through a trace 474 in the package substrate between a via and a solder ball. The system board may then provide connections 476 to any other components of the system, depending on the particular implementation. There may be many more connections than shown and the connections may be configured in a variety of different patterns.

The relentless push for greater miniaturization and more memory drives a demand for higher capacity storage in existing form factors. New form factors are being developed to provide more memory in less space. The configurations described herein may be used to provide 10-15% more space for memory packages on the same system board.

The embodiments described herein allow for more memory in less space and may be configured for small or portable form factors including Internet of Things (IoT) technology in embedded systems. Embodiments may also be configured for use in high power workstations, servers, and data center memory arrays.

The embodiments are described in terms of a memory controller between two memory packages. The memory controller typically provides a bus to route data to appropriate cells of each memory array and also provides for voltage control and regulation. The memory controller may also provide for maintenance, management, fault detection and other functions.

In some embodiments, only one memory package is required in which case, the second package of the pair may be another controller, such as an applications processor. In this case, the packaged applications processor is able to communicate with the packaged memory through a packaged memory controller that is between the two packages and that bridges the gap between the two packages. The system board may then be a motherboard or logic board for a processing system instead of for a memory only system. As mentioned above, the system may be a mobile, portable, IoT device or embedded system for which size is a significant design consideration.

Figure 16:
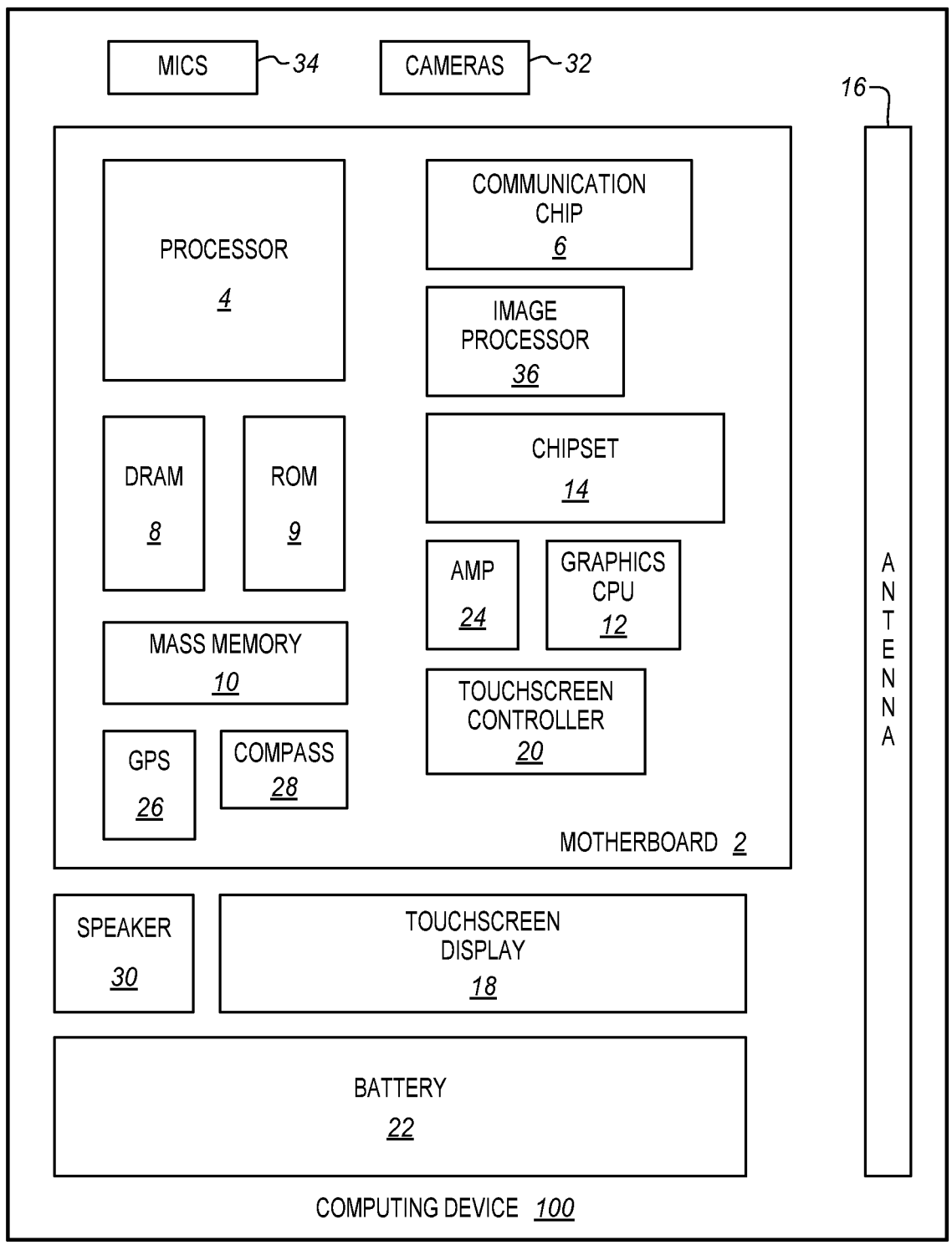
FIG. 16 is a block diagram of a computing device incorporating controller packages between pairs of packages on a system board according to an embodiment.

FIG. 16 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, cameras 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The mass memory 10 may be configured as shown in the above figures using controller packages between pairs of memory packages as described. The mass memory may be mounted on its own system board as in FIG. 1 or to the same system board as the processor and other components. Alternatively or in addition another package such as one for DRAM, ROM, image processor, graphics processor, communications, or sensors may be mounted to the system board 2 as a pair with another package and third package over or between the two as described and shown herein. While the examples are directed to a two memory packages, other combination may be used.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, or a digital video recorder. The computing device may be fixed, portable, or wearable. In further implementations, the computing device 100 may be any other electronic device that processes data or records data for processing elsewhere.

Embodiments may be implemented using one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus includes a system board, a first package mounted to the system board, a second package mounted to the system board, and an interface package mounted between the first and the second package and coupled directly to the first package and to the second package through the respective first and second packages.

In further embodiments the interface package is mounted to a top surface of both the first and the second packages and wherein the interface package is coupled to the first and second packages through the respective top surfaces.

In further embodiments each top surface comprises a land coupled to a through mold via and wherein the interface package comprises a solder ball configured to be coupled to the land.

In further embodiments the first and second packages are covered in a mold compound and have through-mold vias from the respective top surface to respective routing layers of the respective package and wherein the interface package is coupled through the through-mold vias to the routing layers.

In further embodiments the interface package is further coupled to the system board through through-mold vias of the respective first and second packages.

In further embodiments the interface package is coupled to the routing layers of the respective package and from the routing layers through the system board mount to the system board.

In further embodiments the interface package is further coupled to the system board through the respective first and second packages.

Further embodiments include a first redistribution layer over the first package and a second redistribution layer over the second package and wherein the interface package is mounted over the first and the second redistribution layers and is coupled to the packages through the respective redistribution layers.

In further embodiments the first and second packages each comprise a ball grid array through which the respective package is mounted to the system board and wherein the interface package comprises a ball grid array through which the interface package is mounted to each package.

Some embodiments relate to an apparatus that includes a system board having a socket, a first package mounted to the system board, a second package mounted to the system board, and an interface package having a substrate including a connector at an end of the substrate configured to connect to the socket, wherein the interface package is mounted to the socket between the first and the second package orthogonal to the system board and coupled to the first and the second package through the system board.

In further embodiments the connector has a plurality of conductive fingers on a system board and the socket has mating conductive fingers.

In further embodiments the socket is filled with reflowable solder.

In further embodiments the system board defines a cavity below and between the first and second package and wherein the socket is in the cavity.

In further embodiments the socket is coupled to patterned copper layers in the system board.

Further embodiments include a controller die mounted to the interface package substrate and coupled to the connector through the interface package substrate.

Further embodiments include conductive paste between the socket and the connector to attach the interface package to the socket.

In further embodiments the first and second package each contain stacked memory dies.

Some embodiments pertain to a solid state memory drive that includes a system board having an end connector to attach to a main board, wherein the drive provides memory to the main board, interface chips coupled to the end connector, a memory array controller to manage higher level functions of the drive and coupled to the interface chips, a first memory package mounted to the system board, a second memory package mounted to the system board, and an interface package mounted between the first and the second package coupled directly to the first package and to the second package through the respective first and second packages and coupled to the memory array controller through the first and second memory packages.

In further embodiments the interface package is mounted to a top surface of both the first and the second packages and wherein the interface package is coupled to the first and second packages through the respective top surfaces.

In further embodiments the first and second packages are covered in a mold compound and have through-mold vias from the respective top surface to respective routing layers of the respective package and wherein the interface package is coupled through the through-mold vias to the routing layers to connect to memory of each package and to the memory array controller.

The invention claimed is:

1. An apparatus comprising:
 a system board;
 a first package mounted to the system board;
 a second package mounted to the system board; and
 an interface package mounted between the first and the second package and coupled directly to the first package and to the second package.

2. The apparatus of claim 1, wherein the interface package is mounted to a top surface of both the first and the second packages and wherein the interface package is coupled to the first and second packages through the respective top surfaces.

3. The apparatus of claim 2, wherein each top surface comprises a land coupled to a through mold via and wherein the interface package comprises a solder ball configured to be coupled to the land.

4. The apparatus of claim 2, wherein the first and second packages are covered in a mold compound and have through-mold vias from the respective top surfaces to respective routing layers of the respective package and wherein the interface package is coupled through the through-mold vias to the routing layers.

5. The apparatus of claim 4, wherein the interface package is further coupled to the system board through through-mold vias of the respective first and second packages.

6. The apparatus of claim 5, wherein the interface package is coupled to the routing layers of the respective package and from the routing layers through the system board mount to the system board.

7. The apparatus of claim 1, wherein the interface package is further coupled to the system board through the respective first and second packages.

8. The apparatus of claim 1, further comprising a first redistribution layer over the first package and a second redistribution layer over the second package and wherein the interface package is mounted over the first and the second redistribution layers and is coupled to the packages through the respective redistribution layers.

9. The apparatus of claim 1, wherein the first and second packages each comprise a ball grid array through which the respective package is mounted to the system board and wherein the interface package comprises a ball grid array through which the interface package is mounted to each package.

10. An apparatus comprising:
 a system board having a socket;
 a first package mounted to the system board;
 a second package mounted to the system board; and
 an interface package having a substrate including a connector at an end of the substrate configured to connect to the socket,
 wherein the interface package is mounted to the socket between the first and the second package orthogonal to the system board and coupled to the first and the second package through the system board.

11. The apparatus of claim 10 wherein the connector has a plurality of conductive fingers on a system board and the socket has mating conductive fingers.

12. The apparatus of claim 10, wherein the socket is filled with reflowable solder.

13. The apparatus of claim 10, wherein the system board defines a cavity below and between the first and second package and wherein the socket is in the cavity.

14. The apparatus of claim 10, wherein the socket is coupled to patterned copper layers in the system board.

15. The apparatus of claim 10, further comprising a controller die mounted to the interface package substrate and coupled to the connector through the interface package substrate.

16. The apparatus of claim 10, further comprising conductive paste between the socket and the connector to attach the interface package to the socket.

17. The apparatus of claim 10, wherein the first and second package each contain stacked memory dies.

18. A solid state memory drive comprising:
a system board having an end connector to attach to a main board, wherein the drive provides memory to the main board;
interface chips coupled to the end connector;
a memory array controller to manage higher level functions of the drive and coupled to the interface chips;
a first memory package mounted to the system board;
a second memory package mounted to the system board; and
an interface package mounted between the first memory package and the second memory package coupled directly to the first memory package and to the second memory package, the interface package coupled to the memory array controller through the first and second memory packages.

19. The drive of claim 18, wherein the interface package is mounted to a top surface of both the first and the second memory packages and wherein the interface package is coupled to the first and second memory packages through the respective top surfaces.

20. The drive of claim 18, wherein the first and second memory packages are covered in a mold compound and have through-mold vias from the respective top surface to respective routing layers of the respective memory package and wherein the interface package is coupled through the through-mold vias to the routing layers to connect to memory of each memory package and to the memory array controller.

* * * * *